United States Patent
Hersel et al.

[11] Patent Number: 5,839,810
[45] Date of Patent: Nov. 24, 1998

[54] DISPLAY GAUGE

[75] Inventors: Walter Hersel, Wannweil; Ralf Mueller-Sybrichs, Ditzingen; Derk Oreans, Leonberg; Bernhard Friedl, Renningen, all of Germany

[73] Assignee: Robert Bosch GmbH, Stuttgart, Germany

[21] Appl. No.: 809,319

[22] PCT Filed: Nov. 25, 1995

[86] PCT No.: PCT/DE95/01664

§ 371 Date: Apr. 17, 1997

§ 102(e) Date: Apr. 17, 1997

[87] PCT Pub. No.: WO96/19713

PCT Pub. Date: Jun. 27, 1996

[30] Foreign Application Priority Data

Dec. 20, 1994 [DE] Germany .......................... 44 45 482.1
Apr. 22, 1995 [DE] Germany ........................ 195 14 902.5

[51] Int. Cl.⁶ .................................................. G01D 11/28
[52] U.S. Cl. .................................. 362/29; 362/23; 362/84; 116/286
[58] Field of Search .................................. 362/23, 28, 29, 362/84; 116/286, 310, DIG. 35, DIG. 36

[56] References Cited

U.S. PATENT DOCUMENTS 2,908,806  10/1959  Cohen ........................................ 362/84
3,069,509  12/1962  Sherron ..................................... 362/84
3,219,008  11/1965  Harris et al. ............................. 116/286

FOREIGN PATENT DOCUMENTS

OS 29 13 139  10/1979  Germany .

*Primary Examiner*—Thomas M. Sember
*Attorney, Agent, or Firm*—Kenyon & Kenyon

[57] ABSTRACT

A display gauge in which an electroluminescent display is arranged between a dial face and a support plate, the electroluminescent display being connected to electrical components arranged on the back side of the support plate.

10 Claims, 2 Drawing Sheets

DISPLAY GAUGE

This application is a 371 of PCT/DE95/01664 field on Nov. 25, 1995.

BACKGROUND INFORMATION

German Patent Application No. 29 13 139 describes an illuminated measurement pointer. In this a dial face, over which a pointer is rotatably mounted, is applied onto a disk that is at the same time light-conveying. Light is coupled into the light-conveying disk by means of a lamp. The light emerges from the light-conveying disk through the dial face toward an observer, thus serving to illuminate the dial face.

SUMMARY OF THE INVENTION

The display gauge according to the present invention advantageously reduces the installation depth of the display gauge because of the flat design of electroluminescent displays. In addition, the display gauge according to the present invention consumes particularly little current, since the light yield of the electroluminescent display is relatively high. The display gauge according to the present invention is moreover particularly economical to manufacture, since in addition, no optically transparent material is required as a light guide.

Conductor paths on the back of the support plate serve, advantageously, to connect the electrical components to an electrical circuit. Conductor paths can moreover be produced very easily on the support plate by means of known methods, for example photolithography or screen printing.

The electroluminescent display can be adhesively bonded in the form of a finished display, in particular as available commercially, onto the support plate, but can also be produced in particularly space-saving and uncomplicated fashion by printing the individual components for the electroluminescent display onto the support plate.

A connection from the electroluminescent display to the electrical components on the back side of the support plate can be made in very space-saving fashion by means of through-contacting, and in very uncomplicated fashion with a contact element extending around one edge of the support plate.

The electroluminescent display can be manufactured particularly simply, and at the same time is particularly easy to activate, by the fact that an electroluminescent layer is applied, together with a structured electrically conductive layer, onto a common support layer that is guided from the front side of the support plate to the back side of the support plate, in particular because the electrically conductive layer on the back side of the support plate can serve to deliver signals to activate the electroluminescent layer.

If the electrically conductive layer on the back side of the support plate is populated with electrical components, there results the advantage that the electrically conductive layer can at the same time comprise the supply contacts for the electroluminescent layer, and can serve as a layer, having conductor paths, for an electrical circuit.

The display gauge according to the present invention is particularly easy to manufacture if the support layer, along with at least the electrically conductive layer applied thereonto, is flexible, since the support layer can be produced first, along with the electroluminescent layer and the electrically conductive layer, on a planar surface of the flexible support layer, and then a simple bending of the support layer, along with at least the electrically conductive layer, around the support plate can serve to connect the front side and the back side of the support plate correspondingly to the support layer.

An adhesive bonding procedure proves to be particularly cost-saving for mounting the support layer on the support plate.

The same also applies to mounting of the dial face on the electroluminescent layer.

The display gauge according to the present invention is particularly suited for being combined with a pointer drive mechanism and a pointer driven thereby, by the fact that a recess in the support plate for passage of the shaft of the pointer drive mechanism serves, since it is particularly simple in terms of production engineering, to arrange a recess in the arrangement consisting of support plate and electroluminescent display.

The installation depth of the display gauge according to the present invention is in turn decreased if the pointer drive mechanism comprises a stepping motor.

DETAIL DESCRIPTION

Figure 1:
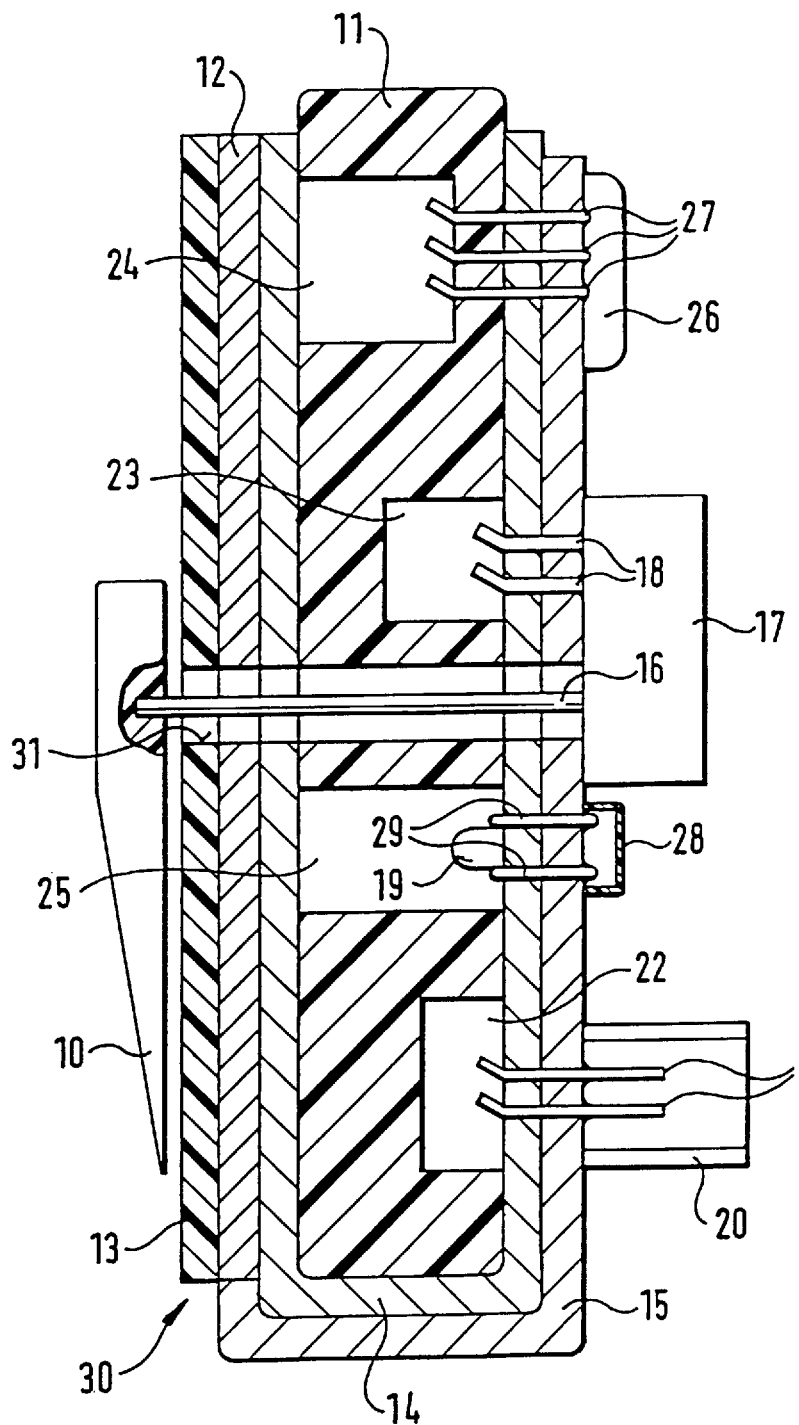
FIG. 1 shows a sectioned side view of a display gauge with an electroluminescent display having a support layer according to the present invention.

FIG. 1 shows a cross section through a flat support plate 11 that has on its front side a depression 24 and on its back side two depressions 22, 23. A support layer 14 is folded around support plate 11 in such a way that support layer 14 covers the front side, the back side, and the underside (connecting the latter two sides) of support plate 11. The portion of support layer 14 located on the front side of support plate 11 is coated with an electroluminescent layer 12. The remaining surface of support layer 14 is coated with an electrically conductive structured layer 15. Electrically conductive layer 15 is structured in such a way that it comprises individual conductor paths, electrically insulated from one another, which serve on the one hand to make contact with electroluminescent layer 12, and on the other hand to make contact with electrical components 19, 20, 26. Electrical component 26 located on the portion of the electrically conductive structured layer 15 located on the back side of support plate 11 is configured here in the form of an integrated circuit whose terminals 27 project through electrically conductive layer 15, support layer 14, and holes in support plate 11 into depression 24 on the back side of support plate 11. Electrical component 20 arranged on the portion of the electrically conductive structured layer 15 located on the back side of support plate 11 is configured, for example, as a plug apparatus whose plug contacts 21 project through electrically conductive layer 15 and support layer 14 into depression 22. Support plate 11 also has an opening 25 which extends from the back side to the front side, and in which electrical component 19, configured as a light-emitting diode with light-emitting diode connection contacts 29, is arranged so that its light is emitted through opening 25 toward the front side. Light-emitting diode 19 is anchored with light-emitting diode connection contacts 29 in support layer 14 and electrically conductive layer 15, such that light-emitting diode connection contacts 29 project out of opening 25, through support layer 14 and electrically conductive layer 15, to the back side. Light-emitting diode connection contacts 29 are covered on the back side with an insulating protective cap 28. Terminals 27 and plug contacts 21 are bent over inside depressions 22, 24 so that the associated electrical components 20, 26 are thereby prevented from falling out. In addition, terminals 27, light-emitting diode connection contacts 29, and plug contacts 21 are electrically connected, for example by soldering, to certain conductor paths of electrically conductive layer 15. A dial face 13 is adhesively bonded onto electroluminescent layer 12. In addition, there is arranged on the back side of support plate 11, on electrically conductive layer 15, a pointer drive mechanism 17 in the form of a stepping motor, which has a shaft 16 that projects through an orifice 31 which extends through dial face 13, electroluminescent layer 12, support layer 14, support plate 11, support layer 14 again, and once again through electrically conductive layer 15. Shaft 16 emerges from orifice 31 on the front side of dial face 13, and serves there to retain a rotatably driven pointer 10. To deliver current, stepping motor 17 has motor contacts 18 which are also connected to certain conductor paths of electrically conductive layer 15, for example by soldering, and which project through support layer 14 into depression 23, where they are prevented from slipping out by kinking, i.e. bending, and thus effect mechanical mounting of the stepping motor 17.

Support layer 14 can preferably be produced from a flexible material. Electroluminescent layer 12 is, for example, adhesively bonded onto support layer 14, and electrically connected to certain conductor paths of electrically conductive layer 15 printed onto support layer 14.

Electrically conductive layer 15 is structured in such a way that current can be delivered to electroluminescent layer 12 via the conductor paths resulting from the structuring. Electrically conductive layer 15 is moreover further structured on support layer 14 so as to result in conductor paths onto which electrical components can be placed in a later step. Since support layer 14, along with electrically conductive layer 15 and electroluminescent layer 12, is flexible, it can be produced as a planar multilayer arrangement and can then be applied onto support plate 11 by being simply folded around it. This multilayer arrangement can be affixed onto support plate 11 by interposition of an adhesive. By means of its structuring into conductor paths on the back side of support plate 11, electrically conductive layer 15 is populated with electrical components 19, 26, 20, thus resulting in an electrical circuit with printed conductor paths and discrete components. Electrical components 20, 26 are also anchored in mechanically stable fashion by bending contacts 21 or terminals 27, respectively, behind support layer 14 or support plate 11. This bending can in some cases occur even before the multilayer arrangement is folded around support plate 11. The electrical circuit on the back side of support plate 11, to activate electroluminescent layer 12 on the front side of support plate 11, can thus be integrated with electroluminescent layer 12 on the common support layer 14. In addition, stepping motor 17 is also mounted on electrically conductive layer 15, the conductor paths of electrically conductive layer 15 also serving to deliver current for stepping motor 17. Thus the activating electronics for stepping motor 17 can also be integrated on support layer 14 with electrically conductive layer 15. In addition, a hole which serves as orifice 31 for the passage of shaft 16 of stepping motor 17 to the front side of dial face 13 has been drilled through the completed arrangement made up of dial face 13, electroluminescent layer 12, support layer 14, support plate 11, and populated electrically conductive layer 15. The hole can, however, also be made in support plate 11 and in the multilayer arrangement individually, so that after the multilayer arrangement is mounted on support plate 11, the holes supplement one another to form orifice 31. Both current for generating light by means of electroluminescent layer 12, and current for activating stepping motor 17, can thus be delivered via the structured electrically conductive layer 15 and electrical components 19, 20, 26. The display gauge thus combines illumination, pointer drive, and the associated electrical circuits, and any further electronic circuits as well, on one flexible support layer 14, thereby advantageously minimizing physical size and production outlay. A separate circuit board is therefore no longer necessary.

Figure 2:
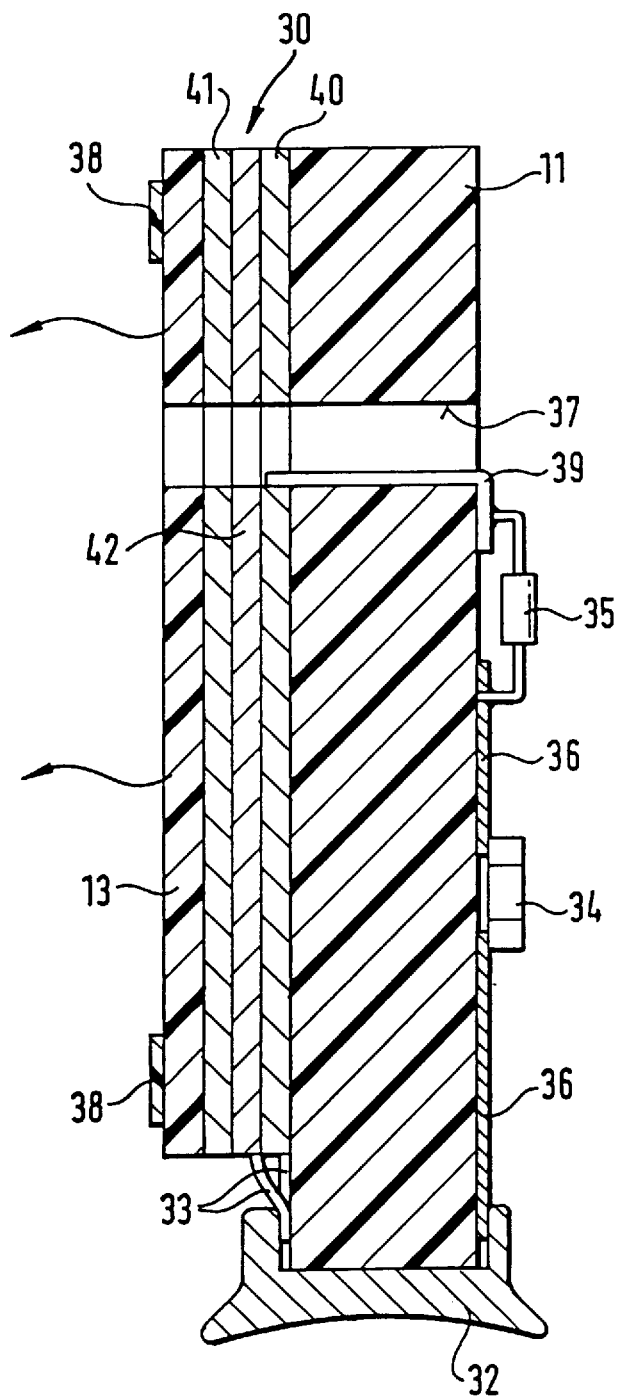
FIG. 2 shows a sectioned side view of a display gauge with an electroluminescent display without a support layer according to the present invention.

FIG. 2 depicts a further exemplified embodiment of the display gauge according to the invention, in which identical numbers designate the same elements as in FIG. 1. Support plate 11 has on its back side a plurality of conductor paths 36 to which electrical components 34, 35 are connected. An SMD component is used, for example, as component 34, and a component with wire connections as further component 35. On the front side, support plate 11 has electroluminescent display 30, which has two electrically conductive layers 40, 41 and a luminescent layer 42 arranged between them. Electrical contacts 33, which project out of electroluminescent display 30 at one edge of support plate 11, are provided in order to connect the two electrically conductive layers 41, 40. Also provided is a contact element 32 that is configured in the form of a clamp, clamp 32 having a plurality of connection paths, electrically insulated from one another, which are not depicted in detail in the drawing and which serve to connect electrical contacts 33 to conductor paths 36 on the back side of support plate 11. A plurality of numerals 38 are applied onto dial face 13 on the surface of electroluminescent display 30. In this example, electroluminescent display 30 has two display regions that can be switched independently of one another. To make contact with the second display region, there is provided, by way of example, an opening 37 in support 11 through which a through contact 39 projects from the back side of support plate 11 to the point where contact is desired to be made with the second display region at one of the two electrically conductive regions 41, 40.

In this embodiment, the circuit for activating electroluminescent display 30 arranged on the front side of support plate 11 is located on the opposite, back side, specifically in the form of an electrical circuit mounted directly on support plate 11. This electrical circuit, with conductor paths 36 and electrical components 34, 35, is preferably produced by a photolithographic process or a screen-printing process, with subsequent population. Support plate 11 thus serves as a circuit board. Orifice 37 and through contact 39 can also be produced as part of this early process step. Contact element 32 serves as the connecting means to the electrical circuit for electrical contacts 33 which are located at the edge of support plate 11. Inherent in contact element 32 is a resilient action which ensures sliding onto support plate 11 and mechanically immovable retention thereon. Electroluminescent display 30 can optionally be used in a finished state, i.e. as a commercially obtainable layer package, by being adhesively bonded onto support plate 11. Alternatively, a printing process can also be used, by applying luminescent layer 42 and then electrically conductive layer 41 onto support plate 11, which in this case already has electrically conductive layer 40 on the front side. Dial face 13 can also be either applied by adhesive bonding or produced by means of a printing process directly on the surface of electroluminescent display 30. Here again, orifice 37 is suitable as a passthrough for shaft 16 of a stepping motor 17, as depicted in FIG. 1. With this arrangement as well, a separate circuit board for the circuit belonging to electroluminescent display 30 is thus no longer necessary, and it is possible to arrange on the back side of support plate 11 not only the circuit for activating electroluminescent display 30, but also a possibly necessary circuit for activating a stepping motor 17 that may be present, or for other functions.

It is of course possible to provide a plurality of display regions which can even have different colors. The connections between these display regions and the circuit on the back of support plate 11 can be made by means of through contacts or by means of contact means extending around the edge of support plate 11. Moreover, clamp 32 can also be implemented by a different electrical connection form, such as a cable, plug connector, etc. The various configurations of the two exemplified embodiments can also be entirely or partially combined with one another.

What is claimed is:

1. A display gauge, comprising:

a support plate;

a partially transparent dial face adapted to be illuminated arranged on a first side of the support plate;

an electroluminescent display arranged between the dial face and the first side of the support plate, the electroluminescent display including an electroluminescent layer and an electrically conductive layer arranged on a common support layer, the common support layer and the electrically conductive layer extending from the first side of the support plate onto a second side of the support plate; and electrical components arranged on the second side of the support plate and connected to the electroluminescent display.

2. The display gauge according to claim 1, further comprising:

conductor paths on the second side of the support plate, the conductor paths being coupled to the electrical components.

3. The display gauge according to claim 1, wherein the electroluminescent display is adhesively bonded to the support plate.

4. The display gauge according to claim 1, wherein the electroluminescent display is printed onto the support plate.

5. The display gauge according to claim 1, further comprising:

passthrough contacts connected on a first end to the electrical components and on a second end to the electroluminescent display.

6. The display gauge according to claim 1, further comprising:

a contact element around an edge of the support plate and connected to the electroluminescent display and to the electrical components.

7. The display gauge according to claim 1, wherein the electrical components are mounted on the electrically conductive layer.

8. The display gauge according to claim 1, wherein the common support layer and the electrically conductive layer are flexible.

9. The display gauge according to claim 1, wherein the common support layer is adhesively bonded onto the support plate.

10. The display gauge according to claim 1, wherein the dial face is adhesively bonded onto the electroluminescent display.

* * * * *